US00RE41983E

(19) United States
(12) Reissued Patent
Wallner

(10) Patent Number: US RE41,983 E
(45) Date of Reissued Patent: Dec. 7, 2010

(54) METHOD OF ORGANIZING AND COMPRESSING SPATIAL DATA

(75) Inventor: Alfred M. Wallner, San Diego, CA (US)

(73) Assignee: Tierravision, Inc., La Jolla, CA (US)

(21) Appl. No.: 12/198,047

(22) Filed: Aug. 25, 2008

Related U.S. Patent Documents

Reissue of:
(64) Patent No.: 6,703,947
Issued: Mar. 9, 2004
Appl. No.: 09/668,695
Filed: Sep. 22, 2000

U.S. Applications:

(62) Division of application No. 11/006,471, filed on Dec. 6, 2004, now Pat. No. Re. 40,466.

(51) Int. Cl.
*H03M 7/00* (2006.01)

(52) U.S. Cl. ..... 341/50; 341/51
(58) Field of Classification Search ..... 341/50, 341/51; 701/213, 215; 342/357.09, 357.1
See application file for complete search history.

(56) References Cited

U.S. PATENT DOCUMENTS

| | | | |
|---|---|---|---|
| 4,520,506 | A | 5/1985 | Chan et al. |
| 4,630,209 | A | 12/1986 | Saito et al. |
| 4,780,717 | A | 10/1988 | Takanabe et al. |
| 4,888,698 | A | 12/1989 | Driessen et al. |
| 4,970,682 | A | 11/1990 | Beckwith et al. |
| 5,202,829 | A | 4/1993 | Geier |
| 5,299,300 | A | 3/1994 | Femal et al. |
| 5,444,618 | A | 8/1995 | Seki et al. |
| 5,543,789 | A | 8/1996 | Behr et al. |
| 5,629,854 | A | 5/1997 | Schulte |
| 5,694,534 | A | 12/1997 | White et al. |
| 5,737,508 | A | 4/1998 | Feigenbaum |
| 5,754,846 | A | 5/1998 | Janse et al. |
| 5,802,492 | A | 9/1998 | DeLorme et al. |
| 5,839,088 | A | 11/1998 | Hancock et al. |
| 5,848,373 | A | 12/1998 | DeLorme et al. |
| 5,881,074 | A | 3/1999 | Rao |
| 5,953,722 | A | 9/1999 | Lampert et al. |
| 5,966,135 | A | 10/1999 | Roy et al. |
| 5,968,109 | A | 10/1999 | Israni et al. |
| 5,974,419 | A | 10/1999 | Ashby et al. |
| 6,018,695 | A | 1/2000 | Ahrens et al. |
| 6,038,559 | A | 3/2000 | Ashby et al. |
| 6,049,753 | A | 4/2000 | Nimura |
| 6,076,039 | A | 6/2000 | Kabel et al. |
| 6,092,076 | A | 7/2000 | McDonough et al. |
| 6,107,944 | A | 8/2000 | Behr et al. |

(Continued)

FOREIGN PATENT DOCUMENTS

| | | |
|---|---|---|
| JP | 2000-197103 | 7/2000 |
| KR | 20000030232 | 6/2000 |
| KR | 20000054183 | 9/2000 |

OTHER PUBLICATIONS

O'Rafferty et al., "A Rapidly Configurable Location–Aware Information System for an Exterior Environment", PRISM, Dept. of Computer Science, University College Dublin (UCD), Dublin 4, Ireland, pp. 334–336, 1999.

*Primary Examiner*—Brian Young
(74) *Attorney, Agent, or Firm*—Knobbe Martens Olson & Bear LLP

(57) ABSTRACT

A method for organizing and compressing spatial data to enable fast, incremental downloads of spatial data over a network. The method comprises multiple steps for segmenting and reducing spatial data, and introduces a location-relevant naming system for storing and accessing the data. Applications installed on remote devices are able to efficiently compute data file names based solely on location information, download the data over a network and cache the data on the device.

63 Claims, 3 Drawing Sheets

U.S. PATENT DOCUMENTS 6,122,594 A 9/2000 Tamaki et al.
6,141,454 A 10/2000 Seymour et al.
6,163,749 A 12/2000 McDonough et al.
6,178,380 B1 1/2001 Millington
6,188,955 B1 2/2001 Robinson et al.
6,201,498 B1 * 3/2001 Fan ..... 342/357.09
6,222,483 B1 4/2001 Twitchell et al.
6,278,939 B1 8/2001 Robare et al.
6,292,745 B1 9/2001 Robare et al.
6,295,502 B1 9/2001 Hancock et al.
6,307,573 B1 10/2001 Barros
6,308,177 B1 10/2001 Israni et al.
6,324,467 B1 * 11/2001 Machii et al. ..... 701/200
6,336,073 B1 1/2002 Ihara et al.
6,424,933 B1 7/2002 Agrawala et al.
6,487,495 B1 11/2002 Gale et al.
6,505,186 B1 1/2003 Muro et al.
6,526,284 B1 2/2003 Sharp et al.
6,556,919 B2 4/2003 Suzuki et al.
6,574,551 B1 6/2003 Maxwell et al.
6,591,270 B1 7/2003 White
6,628,278 B1 9/2003 Ritter
6,703,947 B1 3/2004 Wallner
6,704,645 B1 3/2004 Beesley et al.
6,708,112 B1 3/2004 Beesley et al.
6,795,450 B1 9/2004 Mills et al.
6,868,088 B2 3/2005 Gibson et al.
6,912,596 B2 6/2005 Skidmore et al.
7,047,428 B2 5/2006 Bui
7,054,947 B2 5/2006 Yun
7,079,551 B2 7/2006 Shivnan
7,174,243 B1 * 2/2007 Lightner et al. ..... 701/33
7,181,438 B1 2/2007 Szabo
7,363,126 B1 4/2008 Zhong et al.
7,496,082 B2 * 2/2009 Lee ..... 370/349
7,532,158 B2 * 5/2009 Tekinay et al. ..... 342/357.06
2001/0037305 A1 11/2001 Mochizuki
2003/0060973 A1 3/2003 Mathews et al.
2004/0003132 A1 1/2004 Stanley et al.
2004/0260678 A1 12/2004 Verbowski et al.
2005/0004945 A1 1/2005 Cossins et al.
2005/0125143 A1 6/2005 Beesley et al.
2005/0135413 A1 6/2005 Yang et al.

* cited by examiner

METHOD OF ORGANIZING AND COMPRESSING SPATIAL DATA

Matter enclosed in heavy brackets [ ] appears in the original patent but forms no part of this reissue specification; matter printed in italics indicates the additions made by reissue.

*RELATED APPLICATIONS*

*Notice: More than one reissue application has been filed for the reissue of U.S. Pat. No. 6,703,947. The reissue applications are U.S. application Ser. No. 11/006,471, and U.S. application Ser. No. 12/198,047, filed on Aug. 25, 2008 (the present application), which claims priority as a division of application Ser. No. 11/006,471).*

BACKGROUND OF THE INVENTION

1. Field of the Invention

This invention relates to the field of optimization of spatial databases for functional purposes, and in particular to optimize spatial data to achieve minimal download data size for use with cartographic applications in a networked environment.

2. Discussion of Prior Art

A spatial database comprises topographic information in the form of shapes, lines and points encoded with geodetic coordinates, as well as sets of attributes further describing each form. Internet-based applications use the spatial database to generate bitmap images based on user input such as zip code or address on a server and transmit the map images to client devices. Bitmap-based solutions have numerous limitations, which are well known in the art. While prior art describe systems, which transfer vector data to client devices instead of bitmaps, bitmap solutions remain more efficient in terms of data transfer overhead. The initial download size of vector data is significant, and unless the user interacts repeatedly with the map, the total data amount of vector data is greater than the total data amount of bitmap images. Even if the user interacts frequently with the map and the total download size requirements for bitmap and vector data were about the same, most users prefer to have a number of shorter download wait times rather than one long download wait time. Therefore, except for a few non-mainstream applications, bitmap-based solutions are widely used in networked applications.

In navigation systems, a navigation application and spatial data are packaged and supplied as a complete system on a non-volatile storage medium. Said navigation systems may be installed in vehicles or in standalone devices. These navigation systems rely on significant computing resources such as powerful processors and large permanent storage capacities. Prior art introduces solutions, which use structuring and segmenting of spatial databases to improve data access times and navigational functionality. Said solutions are not applicable when computing resources are severely limited, as encountered on personal digital assistants and smartphones, on which one would want to have access to navigation capabilities and maps. Even when said resources are made available for car navigation systems, more powerful hardware results in higher cost for the system. More importantly still, since spatial data changes quite frequently, standalone car navigation systems will inevitably start producing out-of-date navigation instructions over time. It is therefore necessary to update the local database from time to time. Improved methods for updating said local databases have been introduced by prior art. Nevertheless, the requirement to repeatedly update data used by navigation systems remains a major inconvenience for both consumers as well as navigation system suppliers. Suppliers face substantial costs for creating and distributing the data in regular intervals, and any errors discovered after storing data sets on non-volatile media are costly to fix. To address the above problems, it is desirable to keep frequently changing spatial data on a central server and use wireless transmission networks to deliver navigation functionality to remote devices. Navigational functions such as route calculation and driving directions are performed on the server, making it also easier to integrate real-time road traffic condition data. Driving directions or maneuver instructions are text-based and relatively small in terms of data size, allowing for fairly quick wireless data transmission. On the other hand, the ability to provide graphical, cartographic map display introduces much larger data size overhead. Given the data transfer rates of wireless networks presently and during several years to come, users would experience unacceptably slow performance for map display functionality on remote devices.

The objective of this invention is to introduce a new spatial database system, which reduces the data size, makes it possible to download data in small increments as needed, and which can be used with applications such as navigation systems, for which vector-based functionality is needed.

SUMMARY OF THE INVENTION

The primary object of the invention is to provide a compressed spatial database system, which enables incremental and efficient download of spatial vector data over a network. Another object of the invention is to introduce a location-relevant naming system so that software running on network client devices can efficiently compute data segment file names depending on user interaction with a map or device-supplied location data (e.g. GPS). A third object of the invention is to enable combined online and offline operation capability of a digital map display system. Another object of the invention is to provide server-independent map display capability based on GPS location input. A further object of the invention is to introduce a system allowing updating of dynamic location content without having to retransmit redundant map data. Yet another object of the invention is to enable map centering despite using a segmented data system.

Other objects and advantages of the present invention will become apparent from the following descriptions, taken in connection with the accompanying drawings, wherein, by way of illustration and example, an embodiment of the present invention is disclosed.

In a preferred embodiment of the present invention, a method for organizing and compressing spatial data comprises the steps of parsing a spatial database, separating topographic from attribute information, segmenting the data into rectangles, eliminating subsets of the data points, further reducing the data size by converting the data from a real number format to an integer format, generating location-relevant file names for each of the rectangles and storing the files in permanent storage space. In accordance with a preferred embodiment of the present invention, map display client software computes data file names based on user interactions or device-supplied location information (GPS), fetches the computed file names from a remote server, combines data from several data files to produce an in-memory map image and draws the image on the display screen.

BRIEF DESCRIPTION OF THE DRAWINGS

The drawings constitute a part of this specification and include exemplary embodiments to the invention, which may be embodied in various forms. It is to be understood that in some instances various aspects of the invention may be shown exaggerated or enlarged to facilitate an understanding of the invention wherein.

DETAILED DESCRIPTION OF THE PREFERRED EMBODIMENTS

Detailed descriptions of the preferred embodiment are provided herein. It is to be understood, however, that the present invention may be embodied in vanous forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
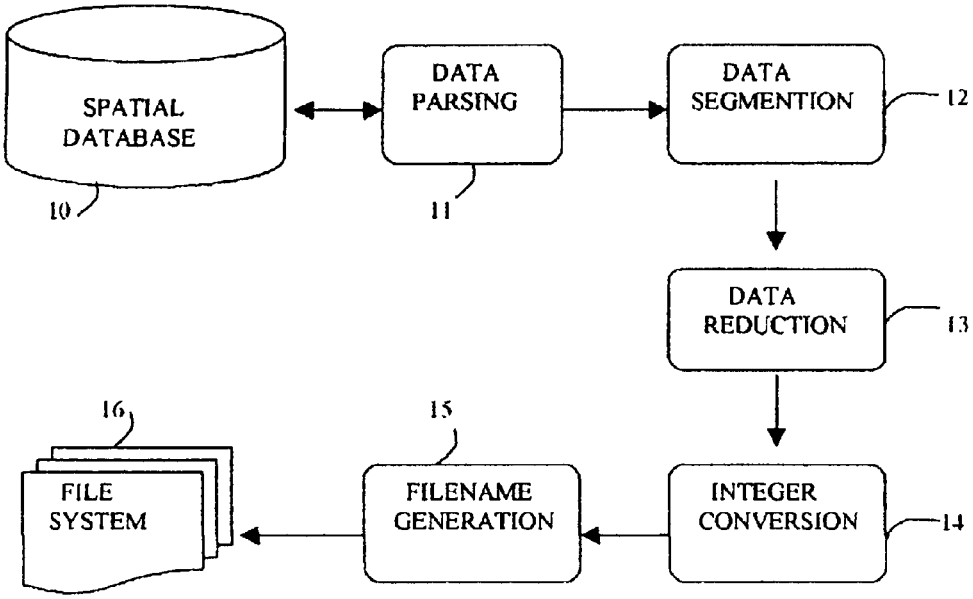
FIG. 1 is a schematic block diagram illustrating the steps to generate a compressed spatial database.

FIG. 1 shows the steps involved in organizing and compressing a spatial database 10. A spatial database comprises topographic information in the form of polygons, lines and points expressed in a geodetic coordinate system (longitude and latitude), and a set of attributes related to the topographic data entities. It is well known in the art that functions using spatial data such as routing or map display only require a subset of the entire data set. For instance, routing does not need to know about lakes and rivers, and map display does not need to know about road turn restrictions and speed limits. It is therefore possible to optimize data sets for use with a particular function. The purpose of this invention is to optimize the data set for map display functionality. The optimization process comprises a number of steps, which are described in more detail below. The initial step 11 consists of parsing the geographic database and extracting all the data for a pre-determined set of features and geographic area. The set of features comprises roads, railways, airports, rivers, lakes, shore lines, parks, points of interest and possibly others, depending how feature-rich the final map display is intended to be. In the preferred embodiment, the predetermined geographic area is a rectangle of 1° longitude and 0.5° latitude, which will be referred to as a level 2 segment.

The parsed data from step 11 is segmented into topographic components and attribute components in step 12. Attribute information is highly redundant and is therefore an obvious compression target. Attribute information is consolidated using a simple attribute pointer or index mechanism. The topographic and attribute components are then further segmented based on location in two steps. In the preferred embodiment, the first segmentation evenly divides the area into an 8×8 grid. Each topographic data entity along with its attributes of each selected feature is assigned to one of the 64 segments. If the data entity is a polygon or a line and falls into several segments, the data entity is decomposed into two or more pieces using mathematical line and polygon splitting algorithms, and each piece is assigned to the correct segment. The resulting data segments are referred to as level 1 segments and are stored in non-volatile memory. Another segmentation is performed on the parsed data from step 11, this time dividing the area into a 64×64 grid. The resulting 4096 data segments are referred to as level 0 data segments, which are also stored in non-volatile memory.

Figure 2:
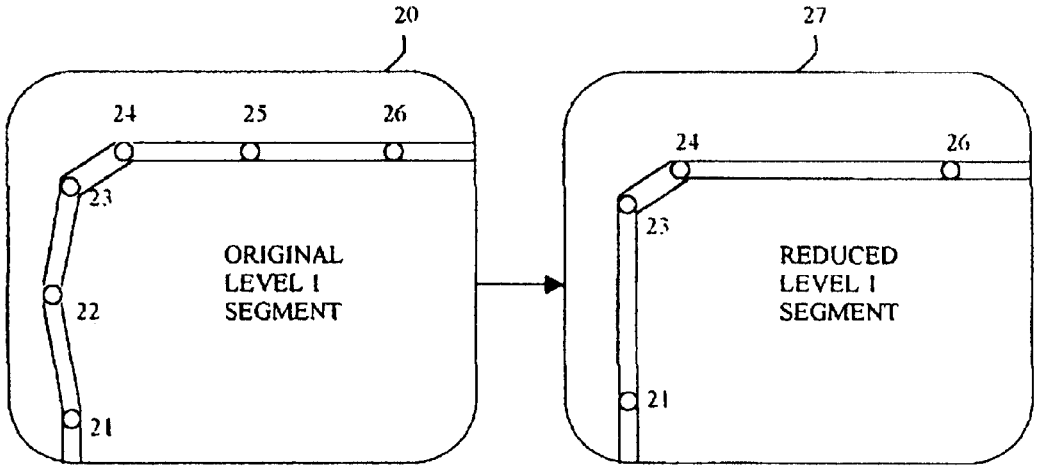
FIG. 2 is a sample view of a road segment before and after applying a data size reduction algorithm.

In step 13, reduction algorithms are performed on level 1 and level 2 data. In the preferred embodiment, level 1 data covers a geographic area of ⅛° longitude by 1/16° latitude. When a map picture is generated for such an area, it is neither desirable nor practical to show all the details, especially when the map picture is shown on a small screen. For instance, it is desirable to show only the main roads, while suppressing the smaller roads. The reduction algorithm used in the preferred embodiments takes these facts into consideration. Two types of data reductions are performed. First, some topographic features such as secondary roads are completely eliminated. Second, the resolution of the remaining topographic features is reduced. Many road data entities contain a number of data points, as shown in FIG. 2, which can be safely eliminated without affecting much the overall geometry of the line or polygon. For instance, the algorithm used in the preferred embodiment eliminates every other data point, provided that the angle between the two lines connecting the point to its adjacent points does not exceed 'n' degrees. Block 20 in FIG. 2 shows a road segment consisting of data points 21 through 26. Block 27 in FIG. 2 shows the same road after two data points, 22 and 25, have been eliminated using the above algorithm. It should be obvious from this example that eliminating these data points did not significantly change the overall shape of the road. Furthermore, it should be noted that the map resolution at this level is fairly low, meaning that data points appearing on a display screen are very close together or even overlapping. Therefore, eliminating data points as described will have no effect on what the viewer sees. After processing all 64 level 1 data files in this way, the level 2 data file is processed in similar fashion. Even more topographic features are completely eliminated. For instance, all roads except for freeways and highways are eliminated, as well as parks, points of interest and possibly other features. Resolution of the remaining topographic features is reduced even further than for level 1 data, for instance by applying the algorithm several times to the data set.

Integer conversion as referred to in block 15 of FIG. 1 has two advantages. It reduces the data size by at least a factor of two, and it improves processing speed on potentially slow devices. Every geodetic coordinate is broken into two components: an offset and a value. The offset may be an aggregation of multiple offsets, but it always represents the topleft corner of a given rectangle. For any level 2 data segment (Lx-min, Lx-max, Ly-min, Ly-max), where Lx-min stands for minimum longitude, Lx-max for maximum longitude, Ly-min for minimum latitude and Ly-max for maximum latitude, the following formulas are used to compute offsets and values for each data point (x, y), where x is the longitude and y the latitude:

$$X2\text{-offset}=Lx-min$$

$$Y2\text{-offset}=Ly-max$$

$$X2\text{-value}=N * (x-x2\text{-offset})$$

$$Y2\text{-value}=N * (y2\text{-offset}-y)$$

N=upper limit of valid integer values (50000 in the preferred embodiment)

The formulas for computing level 1 offsets and values are:

X1-offset=Abs((x−x2-offset)/((Lx-max−Lx-min)/K))

Y1-offset=Abs((y2-offset-y)/((Ly-max−Ly-min)/K))

X1-value=K*N*(x1−x2-offset−x1-offset)

Y1-value=K*N*(y2-offset−y1-offset−y1)

K=segment divisor (8 in the preferred embodiment for level 1 segments)

The formulas for computing level 0 offsets and values are the same as for level 1, except that K equals 64 in the preferred embodiment.

Figure 3:
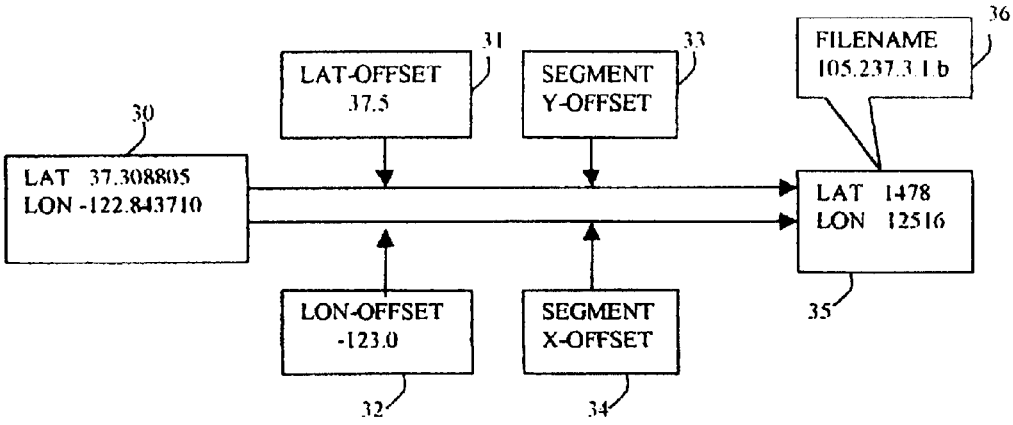
FIG. 3 is a schematic block diagram illustrating the algorithms used for data conversion as well as data segment naming.

The example shown in FIG. 3 applies the above formulas to convert the geodetic coordinates 37.308805 and −122.843710 in block 30 to level 1 integers 1278 and 12516 respectively in block 35.

Level 2 offsets are shown in 31 and 32, while level 1 offsets are shown in 33 and 34. In the preferred embodiment of this invention, the upper limit N is set to 50000, but it could be a different number. The number should not exceed 65536 or 2*16, allowing it to be stored as a 2 byte integer (a short). The number should not be too low, which would result in a loss of spatial accuracy, because several real numbers would map to the same integer. The loss of accuracy is about 1 meter as implemented in the preferred embodiment of this invention.

Once a data segment has been processed and all real numbers converted to integers, a file name is assigned to the data segment as the last step in block 15 of FIG. 1. Since the computed integer values are only distance values from a given base value or offset, they are not reversible to the original real number value without the offset. A simple and efficient way to supply the necessary offset values is to make them part of a file name. As shown in the example of FIG. 3 block 36, a level 1 segment file name is comprised of a total of 4 numbers representing the 4 offsets used to compute integer values for that segment, as well as a letter to indicate the level, the letter 'b' representing level 1. The first number in 36 represents the level 2 latitude offset and the second number in 36 represents the level 2 longitude offset. The third number in 36 represents the level 1 latitude offset, and the fourth number in 36 represents the level 1 longitude offset.

In order to simplify computing requirements, a new geodetic coordinate system is introduced. The North Pole of the earth is at coordinate (0,0) and the South Pole is at (360, 360). Unlike in the standard coordinate system, no negative values are used. Every latitude degree in the standard coordinate system corresponds to 2 latitude degrees in the new system. The conversion from the standard to the new coordinate system is accomplished as follows:

New latitude=90−old latitude*2

New longitude=old longitude when range is 0° to 180°

New longitude=180+(180−old longitude) when range is −180° to 0°

In the new coordinate system, moving south and east always results in greater coordinates, while moving west and north always results in smaller coordinates, until the respective end points 0 and 360 are reached. This system significantly reduces the number of exception checking operations required by map display software when compared to the standard coordinate system.

This shows that the file name contains the offset information for the spatial data stored in the file. Thus, map display software can perform a few simple calculations to compute a file name from any geodetic coordinate, which may be supplied by GPS output. It should also be evident that the task of computing file names for data segments adjacent to a given segment is very straightforward using said file-naming system.

Figure 4:
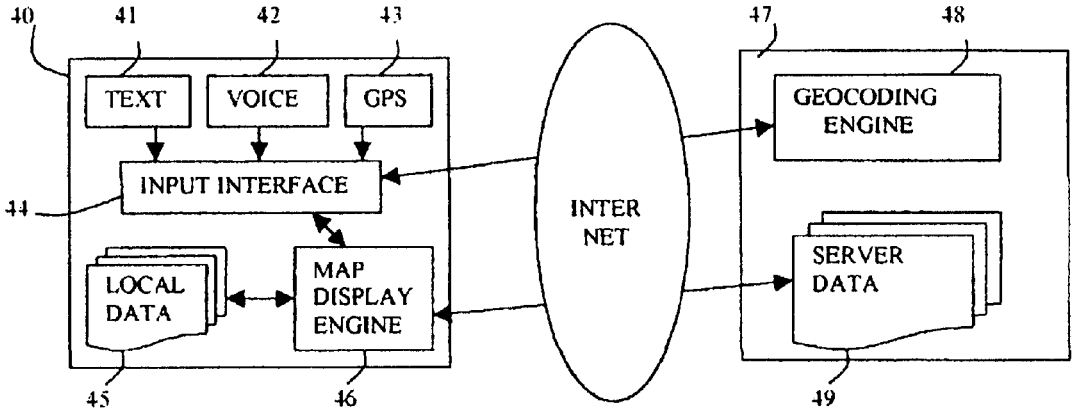
FIG. 4 is a schematic block diagram showing the different components and interactions of a network-based map display system.

The following section describes how a map display program can use said file system and offer desirable functionality such as combined online/offline operation. In a typical embodiment, the map display program is installed on a wireless device such as a smartphone or personal digital assistant. As shown in FIG. 4, a map display system 40 consists of several functional components. The input interface layer 44 handles communication with the user or device. A text-input component lets the user type location information such as an address, a city, a zip code or a start/end point of a trip. The input interface 44 transmits said location information over the network to a geocoding engine 48 residing on a server 47. As is well known in the art, a geocoding engine computes a geodetic coordinate (longitude/latitude) from said information. Once the input interface 44 receives said geodetic coordinate from the geocoding engine 48, it notifies the map display engine 46. Some devices may have voice recognition capabilities. Instead of typing the user speaks said location information. The input interface 44 transmits the information from the voice recognition system 42 to the geocoding engine 48, waits for an answer and forwards it to the map display engine 46. Some devices may have a GPS receiver attached to or incorporated into the device. The input interface 44 processes the GPS output and relays said output to the map display engine 46 without the need to communicate with the geocoding engine 48.

Figure 5:
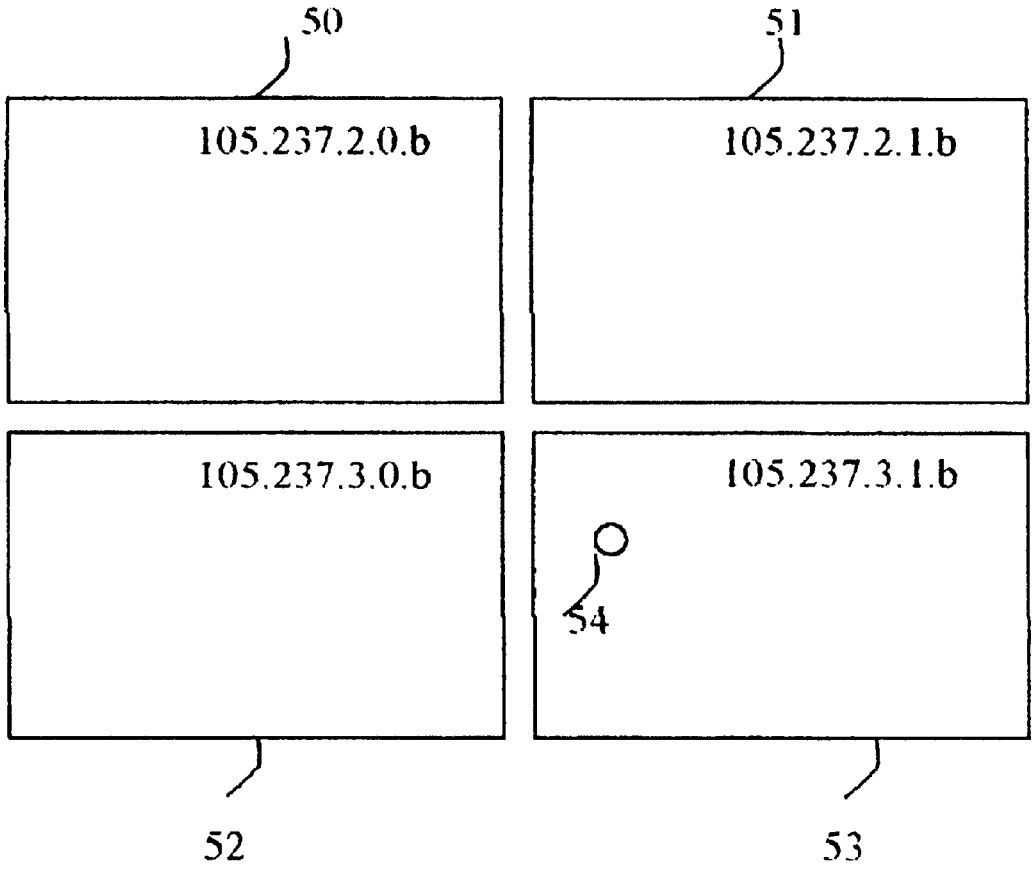
FIG. 5 illustrates which file names are computed by the map display program given a geodetic coordinate.

The map display engine 46 uses said geodetic coordinates received from the input interface 44 to calculate four file names. The input interface 44 also tells the map display engine 46 which data level is needed, e.g. high-resolution level 0 is appropriate when the user specified an address, while level 1 may be more appropriate when the user specified a city or zip code. As has been shown in detail in a previous section, a geodetic coordinate can be decomposed and produce a unique file name. The map display engine 46 could then request said file name from a server 47 on which all files 49 are stored. However, in the preferred embodiment, the map display engine actually computes a total of four file names. If only one file is fetched, the geodetic coordinate of interest to the user could be located somewhere near the edge of said file. It would look awkward to the user and be less informative if the point of interest is not shown at or near the center of the map display screen. The ability to center the map picture has been lost by segmenting the spatial database. The solution employed by the map display engine 46 is to fetch three additional data segment files, which are most adjacent to said geodetic coordinate. The map display engine simply determines into which area, top-left, top-right, bottom-left or bottom-right, said coordinate falls. If a point falls in the top-left quadrant of a file, as does point 54 in FIG. 5, the map display program first finds file 105.237.3.1.b shown in block 53, and then also fetches the file to the top, block 51, to the left, block 52, and to the top-left, block 50. After fetching all 4 files from the server 47, the map display engine combines the data of the 4 files using simple offset calculations before drawing the map picture to the screen. Said geodetic coordinates can now be displayed fairly close (within 25%) of the screen center. An even better center approximation could be achieved by using nine files. Perfect centering can be achieved by not showing a map picture of the entire available data, but instead generate a slightly zoomed-in map picture centered at said coordinate.

One objective of the invention is to provide a flexible mapping system in the sense that the map display system can function online as well as offline. Offline functionality is desirable because it offers the highest speed, since the data is accessed from local storage. The map display engine 46 gives users several options to enable offline capability. Users can select a city or zip code and download all data files for said city or zip code. Furthermore, users can reserve a certain amount of local disk space to be allocated for map data caching. When caching is enabled, the map display engine 46 automatically stores downloaded files on the local disk. As the cache fills up, new data files replace the least frequently accessed data files. A different caching algorithm, for instance based on last accessed time stamps, could be used as well. When the user has selected caching or preloading of data, the map display engine 46 always first scans the local disk space and, if available, loads data files from local space into memory instead of downloading said files from a remote server. Local caching is very useful when users frequently request the same maps. For instance, a user may want to check road traffic conditions on a daily basis. In this case, only updated traffic information such as traffic incident locations or traffic speed maps (a list of measured traffic speeds at different locations) needs to be downloaded. Said updated traffic information can be displayed on a map, which is generated from the map display engine 46 using local map data. Said offline/online capability offers optimal performance for frequently used maps as well as great flexibility regarding local storage capacities of different devices.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

[1. A method for organizing spatial data comprising the steps of:

a) parsing the spatial data into a plurality of packets;

b) segmenting the packets;

c) reducing a size of the packets by eliminating at least one data point from at least one display element by applying an angle comparison between an adjacent display element, wherein the at least one data point is eliminated if an angle between the at least one display element and the adjacent display element is about 180°; and d) generating a name for each of the packets.]

[2. The method of claim 1, wherein the spatial data comprises topographic information comprising a plurality of elements containing geodetic coordinates.]

[3. The method of claim 1, wherein the step of parsing the spatial data comprises:

selecting at least one entity within the data, the entity selected from a group consisting of: a road, a railway, an airport, a river, a lake, a shore line, a park, an entity comprising a geometric shape, and an entity comprising a substantially rectangular shape.]

[4. The method of claim 1, wherein the step of parsing the spatial data comprises:

generating a substantially rectangular element comprising about 1° longitude and about ½° latitude.]

[5. The method of claim 1, wherein the step of parsing the spatial data comprises: separating a topographic element from an attribute element;

wherein the topographic element comprises elements expressed using a geodetic coordinate system; and the attribute element is related to the topographic element.]

[6. The method of claim 1, wherein the step of segmenting the packets comprises:

dividing the packets into at least one element, the element selected from a group consisting of: an 8×8 grid, a 64×64 grid, a substantially rectangular grid comprising about 1° longitude and about ½° latitude, and a substantially rectangular grid comprising about ⅛° longitude and about 1/16° latitude.]

[7. The method of claim 1, wherein the step of reducing the size of the segmented packets comprises:

eliminating elements selected from a group consisting of: a polygon, a lake, a geographic area, a topographic element and an attribute element.]

[8. The method of claim 1, wherein the step of reducing the size of the segmented packets comprises:

eliminating a plurality of data points from a topographic element.]

[9. The method of claim 1, wherein the step of reducing the size of the segmented packets comprises:

transforming a geodetic coordinate from a real number to an integer number, wherein the integer number ranges from about 0 to about 65535.]

[10. The method of claim 1, wherein the step of reducing the size of the segmented packets comprises:

eliminating a plurality of data points from at least one topographic element by applying an angle comparison between an adjacent topographic element line, wherein at least one data point is eliminated if an angle between the at least one topographic element and the adjacent topographic element line is about 180°.]

[11. The method of claim 1, wherein the step of generating the name for each of the packets comprises the step of generating a location-relevant naming system.]

[12. The method of claim 1, wherein the step of generating the name for each of the packets comprises the step of generating a location-relevant naming system, wherein the packet name comprises location information representing an offset from an earth origin.]

[13. The method of claim 12, wherein the earth origin is selected from a group consisting of: a North Pole, and a location other than the North Pole.]

[14. The method of claim 1, further including the step of: repeating any one of steps a, b, c and d to process an entire spatial database.]

[15. A method for displaying a map, the method comprising the steps of:

obtaining information relating to a location;

calculating at least one packet name;

determining a data level;

displaying the map; and caching at least one packet until an amount of computer storage space is filled, and determining which packets should be replaced.]

[16. The method of claim 15, wherein the step of calculating the at least one packet name comprises:

computing the at least one data packet name using a geodetic coordinate.]

[17. The method of claim 15, wherein the step of calculating the at least one packet name comprises:

calculating a request location; and using the request location to calculate the at least one packet name.]

[18. The method of claim 15, wherein the step of calculating the at least one packet name comprises:

computing four adjacent data packet names;

fetching the packets from a server; and combining an information contained in the packets to generate a map.]

[19. The method of claim 15, wherein the step of determining the data level comprises:

determining a resolution level selected from a group consisting of: an address, a city, a zip code and a building floor plan.]

[20. The method of claim 15, further including the step of:

caching at least one data packet until an amount of computer storage space is filled, and determining which packets should be replaced.]

[21. The method of claim 15, further including the step of:

checking a local cache before requesting a data packet from a remote device.]

[22. A method for organizing spatial data comprising the steps of:

a) means for parsing the spatial data into a plurality of packets;

b) means for segmenting the packets;

c) means for reducing a size of the packets by eliminating at least one data point from at least one display element by applying an angle comparison between an adjacent display element, wherein the at least one data point is eliminated if an angle between the at least one display element and the adjacent display element is about 180°; and d) means for generating a name for each of the packets.]

*23. A method of processing map data in conjunction with a portable computing device having a wireless transceiver for data network communication, comprising:*

*computing a map data structure name based on location information or user interactions;*

*downloading the map data structure over a network onto the portable computing device via the corresponding data structure name;*

*caching the map data from the map data structure on the portable computing device;*

*generating a plurality of map images based on at least one of a zip code, address, or geographic location; and*

*transmitting the map images via the wireless data network to the portable computing device.*

*24. The method of claim 23, additionally comprising:*

*combining map data from a plurality of map data files to produce an in-memory map image; and*

*rendering the map image on a display screen of the portable computing device.*

*25. The method of claim 23, wherein the map data structure comprises a file and the data structure name comprises a file name.*

*26. The method of claim 23, wherein the portable computing device includes a server-independent map display capability based on GPS location input.*

*27. The method of claim 23, additionally comprising updating of dynamic location-based content without having to retransmit redundant map data.*

*28. The method of claim 23, additionally comprising enabling automatic map centering in conjunction with a plurality of map segments.*

*29. The method of claim 28, wherein the map segments are stored in the device cache.*

*30. The method of claim 28, wherein the map segments are downloaded from the network.*

*31. The method of claim 23, additionally comprising storing a spatial database of map data comprising geographic information in the form of polygons, lines, and/or points.*

*32. The method of claim 31, wherein the geographic information is expressed in a geographic coordinate system.*

*33. The method of claim 31, wherein the spatial database further comprises a set of attributes related to the geographic data entries.*

*34. The method of claim 23, additionally comprising optimizing data sets on the map data for map display functionality.*

*35. The method of claim 31, additionally comprising parsing the spatial database and extracting all the data for a predetermined set of features and geographic area.*

*36. The method of claim 35, wherein the predetermined geographic area is a rectangle of 1° longitude and 0.5° latitude.*

*37. The method of claim 35, additionally comprising segmenting the parsed data into geographic components and attribute components.*

*38. The method of claim 37, wherein the segmenting is recursively performed a plurality of times.*

*39. The method of claim 37, wherein the segmenting includes dividing the area into a grid.*

*40. The method of claim 23, wherein the portable computing device comprises at least one of a wireless phone or wireless enabled PDA.*

*41. A method of processing map data, comprising:*

*recursively segmenting map data into a plurality of map segments;*

*computing a map data structure name for each map segment, wherein the data structure name comprises geographic-based coordinates and wherein the data structure name comprises a filename; and*

*storing each segment into a data structure comprising a file having a respective map data structure name.*

*42. A method to reduce data in a digital map, comprising:*

*completely suppressing selected geographic features; and*

*reducing the resolution of the remaining geographic features,*

*wherein the reducing comprises eliminating every other data point, provided that the angle between the two lines connecting the point to its adjacent points does not exceed a predetermined angle.*

*43. The method of claim 42, wherein the selected geographic features include secondary roads.*

*44. The method of claim 42, wherein the remaining geographic features include primary roads.*

*45. The method of claim 42, wherein the elimination of data points does not significantly change the overall shape of the road.*

*46. A system for reducing data in a digital map, comprising:*

*means for completely suppressing selected geographic features; and*

*means for reducing the resolution of the remaining geographic features,*

*wherein the reducing comprises eliminating every other data point, provided that the angle between the two lines connecting the point to its adjacent points does not exceed a predetermined angle.*

*47. The system of claim 46, wherein the selected geographic features include secondary roads.*

*48. The system of claim 46, wherein the remaining geographic features include primary roads.*

*49. The system of claim 46, wherein the elimination of data points does not significantly change the overall shape of the road.*

*50. A computer readable storage medium having stored thereon instructions that when executed by a computer processor perform a method of reducing data in a digital map, the method comprising:*

*completely suppressing selected geographic features; and*

*reducing the resolution of the remaining geographic features, wherein the reducing comprises eliminating every other data point, wherein the elimination of data points does not significantly change the overall shape of the road.*

*51. The method of claim 50, wherein the selected geographic features include secondary roads.*

*52. The method of claim 50, wherein the remaining geographic features include primary roads.*

*53. The method of claim 50, wherein the reducing comprises eliminating every other data point, provided that the angle between the two lines connecting the point to its adjacent points does not exceed a predetermined angle.*

*54. A method of assigning names to digital map segments, comprising:*

*segmenting a digital map into a plurality of segments;*

*converting geodetic data points from real numbers to integer numbers; and*

*storing each segment in a data structure comprising a file and having a name comprising data point offset values.*

*55. The method of claim 54, wherein the geodetic coordinates are all positive integers.*

*56. The method of claim 55, wherein the geodetic coordinates are arranged according to the North Pole being at (0, 0), the South Pole being at (360, 360).*

*57. A system for assigning names to digital map segments, comprising:*

*a data segmentation module configured to segment a digital map into a plurality of segments;*

*an integer conversion module configured to convert geodetic data points from real numbers to integer numbers; and*

*a database configured to store each segment in a data structure comprising a file and having a name comprising data point offset values.*

*58. The system of claim 57, wherein the geodetic coordinates are all positive integers.*

*59. The system of claim 57, wherein the geodetic coordinates are arranged according to the North Pole being at (0, 0) and the South Pole being at (360, 360).*

*60. A map display system operating in conjunction with a portable wireless device, comprising:*

*an input interface layer handling communication between a user and the device and being configured to capture user input position information;*

*a geocoding engine, residing on a server, configured to:*

*receive user input position information from the portable wireless device;*

*compute a geodetic coordinate from the user input position information; and*

*transmit the geodetic coordinate to the portable wireless device; and*

*a map display engine configured to use the geodetic coordinates to generate a plurality of data structure names and request the data structures from a map segment server.*

*61. The map display system of claim 60, wherein at least one of the plurality of data structures comprises a file.*

*62. The map display system of claim 60, wherein the map display engine is further configured to display a map image indicative of the data in the data structures.*

*63. The map display system of claim 62, wherein the map picture is centered on a display on the portable wireless device.*

*64. The map display system of claim 62, wherein the map image comprises a slightly zoomed-in map image, which is centered at the geodetic coordinate.*

*65. The map display system of claim 60, wherein the user input position information comprises at least one of an address, a city, a zip code, location information, point of interest, or a start/end point of a trip.*

*66. The map display system of claim 60, wherein the user input position information comprises text.*

*67. The map display system of claim 60, wherein the user input position information comprises voice data.*

*68. The map display system of claim 60, additionally comprising a GPS interface to provide geographic position information for display without access to the geocoding engine.*

*69. A method of operating a map display system in conjunction with a portable wireless device, comprising:*

*receiving user input position information from the portable wireless device;*

*computing a geodetic coordinate from the user input position information;*

*generating a plurality of names based on the geodetic coordinates; and*

*transmitting a data structure comprising map data associated with the geodetic coordinate and associated with the respective data structure names from a map segment server.*

*70. The method of claim 69, wherein the data structure comprises a file.*

*71. The method of claim 69, further comprising:*

*displaying a map image indicative of data of the files, records, segments or strings.*

*72. The method of claim 71, the map image is centered on a display on the portable wireless device.*

*73. The method of claim 71, wherein the map image comprises a slightly zoomed-in map image which, when displayed, is centered at the geodetic coordinate.*

*74. The method of claim 69, wherein the user input position information comprises at least one of an address, a city, a zip code, location information, point of interest, or a start/end point of a trip.*

*75. The method of claim 69, wherein the user input geographic position information comprises text.*

*76. The method of claim 69, wherein the user input geographic position information comprises voice data.*

*77. The method of claim 69, additionally comprising receiving global positioning system (GPS) data to provide position information for display without access to the geocoding engine.*

*78. A method of caching digital map segments in a portable wireless device, comprising:*

*allocating a portion of memory for digital map segments in a cache;*

*executing a caching algorithm to manage the allocated cache; and*

*loading map data for rendering map images on a display from the cache if a particular digital map segment is stored in cache, otherwise requesting download of the particular digital map segment from a network.*

*79. The method of claim 78, wherein the caching algorithm uses a least frequently used technique to determine which map segments to discard when the allocated cache is full.*

*80. The method of claim 78, wherein the caching algorithm uses a last accessed technique to determine which map segments to discard when allocated cache is full.*

*81. A system for caching digital map segments in a portable wireless device, comprising:*

*a map display engine configured to:*

*allocate a portion of memory for digital map segments in a cache; and*

*execute a caching algorithm to manage the allocated cache, wherein the map display engine is further configured to load data for rendering an image on a display from the cache if a particular digital map segment is stored in the device, otherwise requesting download of the particular digital map segment from a network.*

*82. The system of claim 81, wherein the caching algorithm uses a least frequently used technique to decide which map segments to discard when the allocated cache is full.*

*83. The system of claim 81, wherein the caching algorithm uses a last accessed technique to decide which map segments to discard when the allocated cache is full.*

*84. The system of claim 81, wherein the map display engine is further configured to request download of a plurality of digital map segments adjacent to the particular digital map segment.*

*85. The method of claim 78, wherein requesting download of the particular map segment from the network is based on a data level of the particular map segment.*

* * * * *